United States Patent [19]
Spaeth et al.

[11] Patent Number: 5,566,265
[45] Date of Patent: Oct. 15, 1996

[54] TRANSMISSION AND RECEPTION MODULE FOR A BIDIRECTIONAL, OPTICAL MESSAGE AND SIGNAL TRANSMISSION

[75] Inventors: Werner Spaeth, Holzkirchen; Wolfgang Gramann, Regensburg; Hans-Ludwig Althaus, Lappersdorf; Ralf Dietrich, Munich, all of Germany

[73] Assignee: Siemens Aktiengesellschaft, Munich, Germany

[21] Appl. No.: 361,519

[22] Filed: Dec. 22, 1994

[30] Foreign Application Priority Data

Dec. 22, 1993 [EP] European Pat. Off. .............. 93120733

[51] Int. Cl.⁶ .................. G02B 6/00; G02B 6/36
[52] U.S. Cl. ........................................... 385/93
[58] Field of Search ........................... 385/88–93

[56] References Cited

U.S. PATENT DOCUMENTS

| | | | |
|---|---|---|---|
| Re. 34,790 | 11/1994 | Musk | 385/93 |
| 4,119,362 | 10/1978 | Holzman | 385/93 |
| 4,726,648 | 2/1988 | Haberland et al. | 385/93 |
| 4,749,250 | 6/1988 | Carter | 385/93 |
| 4,753,508 | 6/1988 | Meuleman | 385/93 |
| 4,762,386 | 8/1988 | Gordon et al. | 385/93 X |
| 4,767,171 | 8/1988 | Keil et al. | 350/96.18 |
| 4,790,618 | 12/1988 | Abe | 385/93 |
| 4,807,238 | 2/1989 | Yokomori | 372/32 |
| 5,073,047 | 12/1991 | Suzuki et al. | 385/93 |
| 5,127,075 | 6/1992 | Althaus et al. | 385/94 |
| 5,487,124 | 1/1996 | Bowen et al. | 385/93 |

FOREIGN PATENT DOCUMENTS

| | | | |
|---|---|---|---|
| 0199565A3 | 10/1986 | European Pat. Off. | H01S 3/02 |
| 0243170A2 | 10/1987 | European Pat. Off. | H01L 31/12 |
| 0545905A3 | 6/1993 | European Pat. Off. | H01S 3/025 |
| 2213957 | 8/1989 | United Kingdom | H01S 3/025 |
| WO93/21551 | 10/1993 | WIPO | H01S 3/025 |

OTHER PUBLICATIONS

Patent Abstracts of Japan, Publication No. JP61243963, published Oct. 30, 1986, vol. 11, No. 93, Oikami Hiroshi "Semiconductor Laser Device".

*Primary Examiner*—Akm E. Ullah
*Attorney, Agent, or Firm*—Hill, Steadman & Simpson

[57] ABSTRACT

A bidirectional transceiver module for message and signal transmission via a light waveguide is formed of a lens coupling optics, a laser chip as a light transmitter, a light receiver, and a beam splitter intervening in the beam path. These parts are at least partially surrounded by a housing. They are designed such that, given reduced manufacturing expense, a lens coupling optics arranged immediately in front of the laser chip can be adjusted in a simple way and can be fixed in stable fashion. The laser chip is arranged on a common carrier between two carrier parts whose lateral surfaces neighboring the resonator faces of the laser chip are provided with mirror layers and are inclined at an angle of approximately 45° relative to the resonator faces for beam deflection onto the lens coupling optics secured above the laser chip on at least one carrier part. The mirror layer neighboring the front side of the laser chip is provided with the beam splitter. The light receiver or an optical coupling for this is provided at the underside of the common carrier.

23 Claims, 2 Drawing Sheets

TRANSMISSION AND RECEPTION MODULE FOR A BIDIRECTIONAL, OPTICAL MESSAGE AND SIGNAL TRANSMISSION

RELATED APPLICATION

The present application is related to copending application, Attorney's Docket No. P-94,3125, U.S. application Ser. No. 08/361,512 filed on Dec. 22, 1994 now pending inventors Werner Spaeth et al, and entitled "OPTOELECTRONIC COMPONENT AND METHOD FOR THE MANUFACTURE THEREOF".

BACKGROUND OF THE INVENTION

The invention is directed to a transmission and reception module for a bidirectional, optical message and signal transmission.

Such transmission and reception modules are known and are disclosed, for example, by EP-A-0 463 214, corresponding to U.S. Pat. No. 5,127,075. Such modules are utilized for bidirectional message or data transmission in full duplex or half duplex operation.

In a transmission and reception module for a bidirectional, optical communication network disclosed by EP-A-0 238 977, corresponding to U.S. Pat. No. 4,767,171, two spherical lenses that focus the laser light onto the fiber end are arranged at a distance from one another essentially between a laser diode and an end of an optical fiber. A light beam separating means or a beam splitter is arranged between the spherical lenses. This beam splitter separates the light divergently beamed from the fiber end in the direction of the transmitter-remote lens. This lens, having a wavelength different from the wavelength of the laser light from the beam path, focuses and conducts the light to a detector or light receiver. In order to avoid a de-adjustment sensitivity of such a module, the laser diode and the lens lying close thereto are fixed relative to one another on a common carrier body so that they are resistant to de-adjustment. At least the laser diode or the light transmitter, the transmitter-proximate lens, the light beam separating means (beam splitter) and the light receiver (detector) are accepted in a housing to which an end of an optical fiber can be connected, this end being arranged in the focus of the light of the one wavelength that is stationarily defined relative to the common housing. The housing is hermetically tight for protection against disturbing environmental influences, particularly of the active semiconductor components (light transmitter and light receiver) accommodated in the housing.

SUMMARY OF THE INVENTION

It is an object of the invention to significantly reduce the manufacturing expense given a transmission and reception module of the type initially cited, and of designing the module such that a lens coupling optics arranged immediately in front of the laser chip can be adjusted and fixed in stable fashion in a simple way.

According to the present invention, a transmission and reception module is provided for bidirectional message and signal transmission via a light waveguide. A lens coupling optics, a laser chip as a light transmitter, a light receiver, and a beam splitter arranged in a beam path are provided. These parts are at least partially surrounded by a housing. The laser chip is arranged on a common carrier between two carrier parts whose lateral surfaces neighboring the resonator faces of the laser chip are provided with mirror layers and are inclined at an angle of approximately 45° relative to the resonator faces. Accordingly, the radiation emitted by the laser chip to the surface of the common carrier is directed nearly perpendicularly up onto the lens coupling optics arranged above the laser chip. The lens coupling optics is secured to at least one of the carrier parts. The mirror layer neighboring the front side of the laser chip is provided with a beam splitter that reflects the radiation emitted by the laser chip and allows the radiation fed in from the light waveguide via the lens coupling optics to pass. The light receiver or optic coupling of the light receiver is provided under the beam splitter on the underside of the common carrier.

The advantages achieved with the invention are particularly that the transmission and reception module has a structure that, utilizing components and techniques of micromechanics and micro-optics, allows both a simplified mounting of the laser chip on a sub-carrier (submount) and also allows an especially rational manufacture of a plurality of such module sub-components in a wafer union. All mechanical connecting elements and optical imaging elements, as well as the laser chip, can thereby be simultaneously mounted and then detached and housed. The module is distinguishec by a space-saving structure, a mechanically stable lens coupling optics, and by a defined emission characteristic.

The bidirectional module can be especially advantageously employed as an opto-electronic transmission and reception component for the optical signal or message or data transmission via light-conducting, optical fibers such as light conductors of plastic or glass, or what are referred to as multimode or monomode fibers of quartz.

The invention shall be set forth in greater detail below with reference to exemplary embodiments shown in the drawings.

DESCRIPTION OF THE PREFERRED EMBODIMENTS

Figure 1:
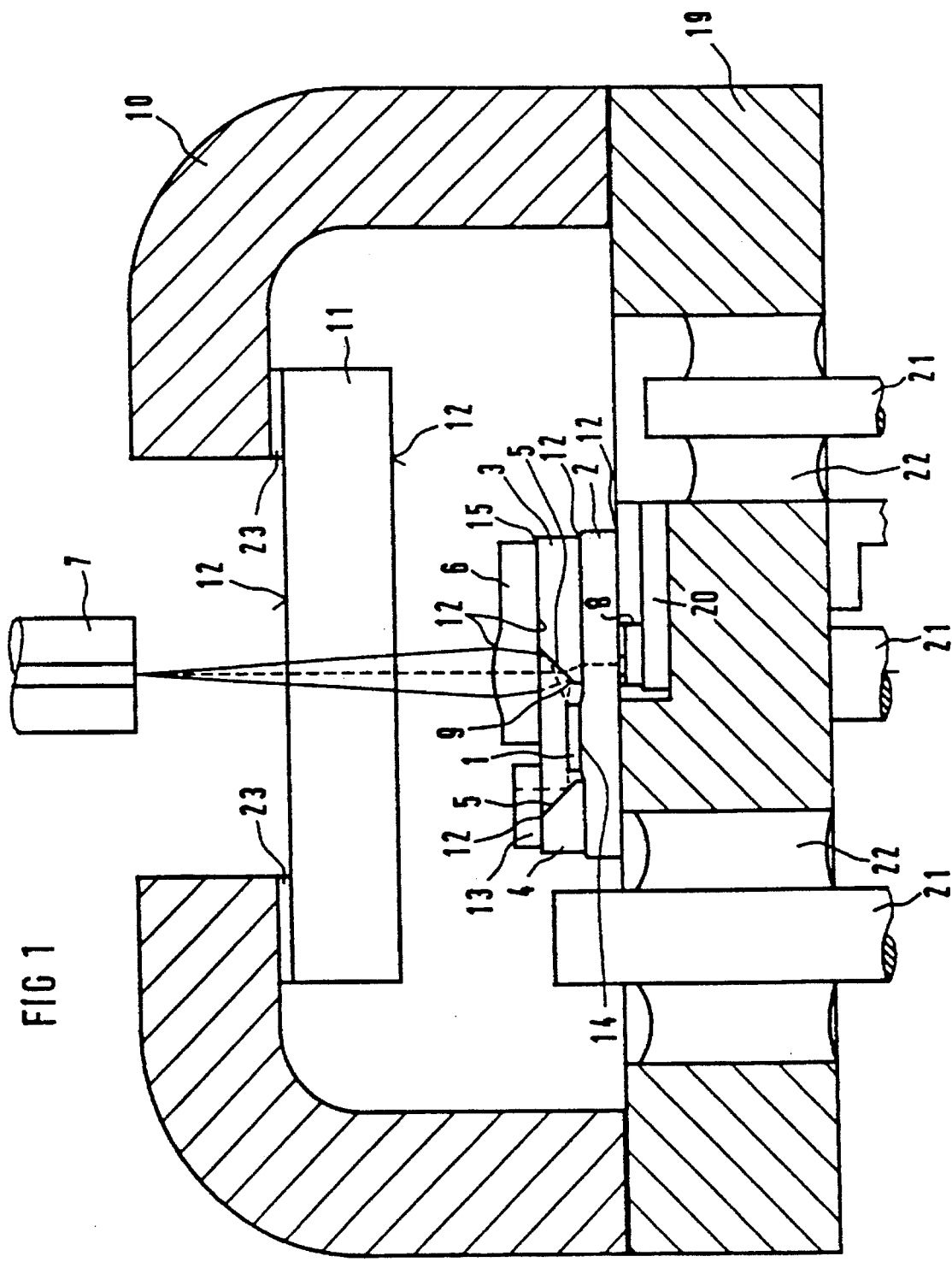
FIG. 1 is a bidirectional transmission and reception module having a light receiver integrated in the housing.
Figure 2:
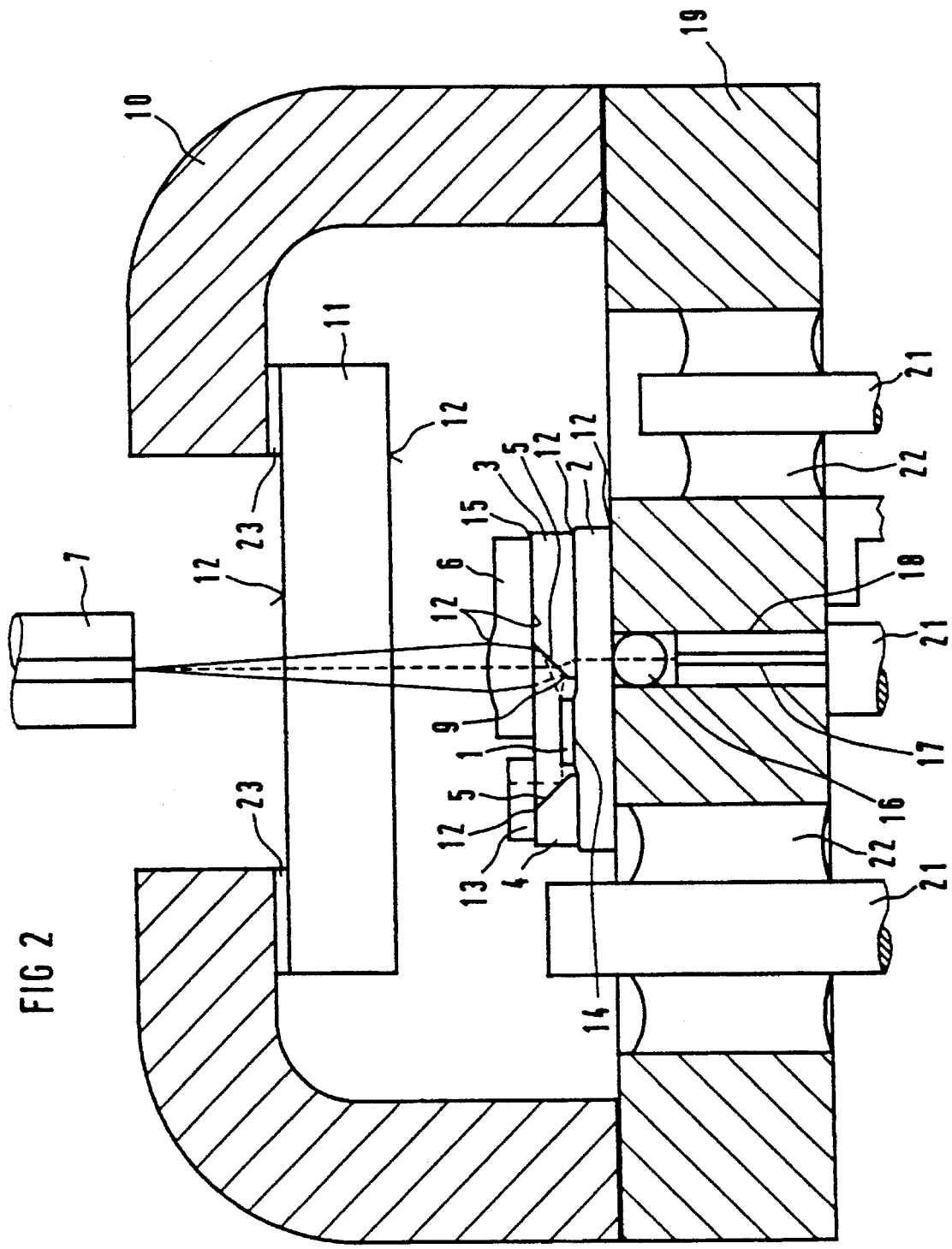
FIG. 2 is a bidirectional transmission and reception module having an optical coupling for an external light receiver integrated in the housing.

The bidirectional transmission and reception module schematically shown in FIGS. 1 and 2 is essentially composed of a laser chip 1 as a light transmitter comprising a lens coupling optics 6, a light receiver 8, and a beam splitter 9 intervening in the beam path. These parts are at least partially encompassed by a housing 10. An external light waveguide 7 can be optically coupled to the module. The optical coupling thereby occurs through a window 11 in the housing 10 via the lens coupling optics 6 arranged above the laser chip 1. The window 11 is glazed to the housing 10 with a glass layer 23. The laser chip 1 is arranged on a common carrier 2 that is preferably composed of silicon and, as a submount, can be mounted, for example, on the bottom plate 19 of a TO housing. The laser chip 1 is arranged on the common carrier between two carrier parts 3, 4 whose lateral surfaces neighboring the optical resonator faces of the laser chip 1 are provided with mirror layers 5 and that are inclined at an angle of approximately 45° relative to the resonator faces, so that the coherent radiation emitted by the laser chip 1 as a divergent light beam to the surface of the common carrier 2 is deflected nearly perpendicularly upwardly onto the lens coupling optics 6 arranged above the laser chip 1. The two carrier parts 3, 4 are preferably composed of glass or, like the carrier 2, of silicon, and comprise a trapezoidal profile. Particularly for simplifying the adjustment and fastening of these two carrier parts 3, 4, it is advantageous to provide depressions or trenches mathing therewith in the common carrier 2, the carrier parts 3, 4 being then inserted thereinto and secured therein. Layers of dielectric material are expediently applied onto the neighboring lateral surfaces of the carrier parts 3, 4 as mirror layers 5. The lens coupling optics 6 is arranged and secured on at least the one carrier part (on the carrier part 3 in these exemplary embodiments) such that the radiation emitted by the laser chip 1 impinges these in nearly perpendicular fashion.

The mirror layer 5 neighboring the front side of the laser chip 1 is provided with a beam splitter 9 that reflects the radiation emitted by the laser chip 1 and allows the radiation fed in from the light waveguide 7 via the lens coupling optics 6 to pass. The light receiver 8 (FIG. 1) or an optical coupling (FIG. 2) for the light receiver 8 is provided under the beam splitter 9 on the underside of the common carrier 2. The optical coupling for the light receiver 8 expediently comprises a further light waveguide 17 and/or a further lens coupling optics 16 and, according to FIG. 2, is located, for example, in a bore 18 in the bottom plate 19 of the housing 10.

The beam splitter 9 forms an optical separating means for different or identical light wavelengths. A separation of more than 95° can be achieved for different light wavelengths of the transmission and the reception branch, i.e. when the beam splitter works wavelength-selectively. A 50% separation or some other separation can be set, given identical wavelengths for both branches.

In order to achieve a bidirectional transmission, the mirror layer 5 neighboring the front side of the laser chip 1, which mirror layer 5 is applied on the carrier part 3, needs merely to be provided with a filter layer as a beam splitter 9. This mirror layer 5 reflects the laser light of one wavelength emitted by the laser and allows the light of a different wavelength coming from the optical fiber 7 to pass. Silicon is transparent given light having a wavelength longer than 1.1 μm, and it suffices to apply a suitable light receiver 8 or a suitable optical coupling for an external light receiver 8 at the location of the light exit on the underside of the common carrier 2 that is preferably composed of silicon. A photodiode, a transistor or a photo-IC, potentially having an integrated, discrete, or hybrid amplifier, expediently serves as light receiver 8. The light receiver 8 can be mounted on the carrier 2 either discretely in a recess or on a suitable submount 20. The light receiver is expediently provided with adjustment marks that serve the purpose of adjusting the laser chip 1 relative to the light receiver 8.

The lens coupling optics 6 is preferably a lens chip having an integrated refractive and/or diffractive lens. This lens chip or the lens coupling optics 6 can also be adjusted and fixed on both carrier parts 3, 4 spanning the laser chip 1. Dependent on the wavelength emitted by the laser chip 1, the lens chip 1 is expediently composed of a correspondingly transmissive glass or semiconductor material such as silicon, silicon carbide or gallium phosphide. The lens chip, which can be arranged one-sided on only one carrier part or both-sided on both carrier parts 3, 4 as lens coupling optics 6, is advantageously applied and secured onto the one or onto both carrier parts 3, 4 with its structured and/or curved side down, i.e. having this side facing toward the laser chip 1. Such an arrangement, in particular, is more tolerance-friendly than an arrangement having an outer curvature or structure. For example, a spherical tens or cylinder lens that is secured in an opening in a lens carrier that, for example, is composed of silicon can also be employed as lens coupling optics 6 instead of a lens chip having an integrated lens.

The plurality of submounts essentially composed, for example, of the common carrier 2, the laser chip 1, the carrier parts 3, 4 and of the lens coupling optics 6 can be especially rationally manufactured in a wafer union. A wafer preferably composed of silicon is thereby provided—as common carrier 2—with suitable metallic structures 14 for bonding the laser chips 1. Parallel depressions or trenches having, for example, a width and spacing of a few 100 μm, are expediently etched into this carrier 2. The trench depth can amount from one through a few 100 μm. Carrier parts 3, 4, preferably having the shape of prism stripes with a trapezoidal profile wherein the extensions of the two lateral surfaces intersect at a right angle, are directly introduced into the depression or onto the common carrier 2, and are bonded anodically or with a soldering technique. The neighboring lateral surfaces of the carrier parts 3, 4 are provided with mirror layers 5. Dielectric mirrors of layer sequences such as $SiO_2$-$TiO_2$, $SiO_2$-Si, $Al_2O_3$-Si or combinations of these layer sequences and other dielectric layers are advantageously applied. The narrower upper side of the prismatic carrier parts 3, 4 can be provided with a solderable metal layer structure 9 of, for example, Ti-Pt-Au, Cr-Pt-Au, Ti-Ni-Au, Ti-Pt-AuSn, Ni-Au or other solderable layers.

For constructing the submounts, the laser chips I that, dependent on the requirements, have their underside facing toward the carrier 2 provided with a solder layer of Ausn, AuGe, AuSi, PbSn or other solderable layers having a thickness of approximately 1 μm through 10 μm, are now soldered onto the metal pads or metallic structures 14 provided on the common carrier part at a defined spacing in front of the carrier parts 3, 4.

The specific embodiment of the laser submount with reflective, prism-shaped carrier parts 3, 4 for beam deflection now makes it possible to utilize the testing on a standard wafer tester having only one additional optical measuring head for acquiring the optoelectronic quantities that are standard in semiconductor technology, but which have hitherto not been capable of being employed given known laser edge-emitters.

After the measurement, the wafer can be optionally separated into the individual submounts (carrier 2), whereby each submount (carrier 2) contains one laser chip 1 and a respective part of the prism-shaped carrier parts 3, 4 in front of the front and back side of the laser chip 1. The division of the wafer, preferably a silicon wafer (carrier 2), into individual submounts can also have already been undertaken before the mounting of the laser chips 1. The submounts can then be individually further-processed.

Before or after the detachment of the submounts, a lens coupling optics 6 (in the form of a lens chip here whose lens can be refractive and/or diffractive) is then actively or passively (i.e., with or without laser operation as an auxiliary) adjusted in the x-direction and the y-direction over the mirror layer 5 of the carrier part 3 in front of the front side of the laser chip 1, and is expediently secured on the surface of the carrier part 3 with soldering or gluing. The necessary solder can be applied onto the lens chip by, for example, vapor-deposition, this then being melted for fixing under a pressure contact with the substrate (carrier part 3). The thermal resistance of the carrier part 3, for example a glass prism, is dimensioned such that only an insignificant heating of the material of the carrier 2, for example the Si substrate, occurs during the soldering process.

The sum of the spacings between the front side of the laser chip 1 and the carrier part 3, between the carrier part 3 and the lens chip 6, and the optical thickness of the lens in the lens chip 6 yields the subject-to-lens distance of the optical imaging. When, however, the curved surface of the lens chip 6 faces away from the laser chip, then the optical thickness of the lens of the lens chip 6 is to be taken into consideration as a part of the subject-to-lens distance. Given a fixed spacing between the carrier part 3 and the lens chip 6 and a fixed optical thickness of the lens in the lens chip 6, the subject-to-lens distance can be set or varied solely via a lateral displacement, i.e. via a modification of the spacing of the front side of the laser chip 1 from the carrier part 3, being set toward this or away from this. The z-adjustment has thus been transformed into a simple lateral adjustment. The imaging of the laser spot onto the core of an optical fiber that is located at a prescribed distance in front of the lens of the lens chip 6 can thus be set in an extremely simple way.

The lens chips that are employed can be manufactured in a wafer process with specific photolithographic and etching-oriented processes. The lens material is selected dependent on the technical demands. Silicon is advantageously employed for wavelengths longer than 1.1 μm. Special glasses or semiconductor materials such as, for example, gallium phosphide or silicon carbide are advantageously employed for shorter wavelengths. Silicon, however, can also only be the carrier for lenses. The employment of silicon yields an especially stable structure with respect to temperature changes since the common carrier 2 (submount), carrier parts 3, 4 (for example, glass prisms) and lens coupling optics 6 (lens chips) have nearly the same coefficient of expansion in the temperature intervals that come into consideration.

Expediently, a suitable monitor diode 13 can be applied on the upper side of the one carrier part 4 that lies opposite the carrier part 3 carrying the lens coupling optics 6, being applied in such a way that a part of the diode projects over the mirror layer 5 applied on the carrier part 4. The photons (backside light) that emerge from the back mirror (back resonator side) of the laser chip 1, and that are reflected upward at the neighboring mirror layer 5, can thus reach the pn-junction of the monitor diode via the transparent substrate of the monitor chip 7. Given monitor diodes that do not have a transparent substrate, the diode is applied onto the carrier part 4 with its pn-junction down. The monitor chip 13, however, can also be arranged over or on the lens coupling optics 6 insofar as, for example, a lens chip extends over both carrier parts 3, 4.

After optoelectronic testing, the common carriers 2 (submounts) on which laser chip 1, carrier parts 3 and 4, lens coupling optics 6, and monitor chip 7 are located, i.e. the micromodules, can be mounted on an overall carrier, for example the bottom plate of a TO housing, that has been provided. They are mounted like a standard semiconductor chip with die-bonding and wire-bonding techniques. The electrical leads 21, or contacts required for the optoelectronic components of the module, can also be provided in the bottom plate 19 and can be secured therein with a glazing 22.

At those locations at which light enters or exits, the transmission and reception module has an optical coating layer 12 of preferably silicon nitride ($Si_3N_4$). Carrier part 3 and coating layer 12 have physical contact with one another (spacing less than one tenth the wavelength) at the light entry location under the prism-shaped carrier part 3, so that reflection losses on the side of the carrier part 3 or on the side leading to the light receiver 8 are likewise avoided.

Given an optical radiation (light) having a wavelength shorter than 1.1 μm, an opening can be etched into the common carrier 2 (submount) preferably composed of silicon, so that the light can directly impinge the light receiver 8 (for example, photodiode) from the carrier part (prism) via air.

If it proves necessary for blocking laser light that can derive from reflections, a suitable filter can be applied to the light entry side of the light receiver 8. The filter can be glued on. The filter can be an absorption or reflection filter. The filter, however, can also be applied directly in or on the reception diode as an epitaxial layer or dielectric filter.

In half-duplex operation, the beam splitter 9 is designed as a 3 dB splitter on the mirror layer 5 of the carrier part 3, since the wavelengths of the laser and the light waveguide differ only slightly from one another in this case. Filters over the light receiver 8 are therefore not necessary.

Given the exemplary embodiment shown in FIG. 2, the light receiver 8 is not provided inside the housing 10 as in FIG. 1, but is provided as an external component outside the housing 10. For this purpose, the transceiver module has an optical coupling for an external light receiver that is composed of a further lens coupling optics 16 in the form of a spherical lens and of a further light waveguide 17 in this exemplary embodiment, these being provided in a bore 18 in the bottom plate 19 of the module housing 10 and being secured therein.

Although various minor changes and modifications might be proposed by those skilled in the art, it will be understood that we wish to include within the scope of the patent warranted hereon all such changes and modifications as reasonably come within our contribution to the art.

We claim as our invention:

1. A transmission and reception module for bidirectional message and signal transmission via a light waveguide, comprising:

a common carrier having a laser chip as a light transmitter thereon, and first and second carrier parts also on the common carrier with a laser chip therebetween, the first and second carrier parts having lateral surfaces neighboring resonator faces of the laser chip, said lateral surfaces having respective mirror layers inclined at an angle of approximately 45° relative to the resonator faces so that radiation emitted by the laser chip at a surface of the common carrier is directed substantially perpendicularly upwardly relative to the common carrier;

a lens coupling optics secured to at least said first carrier part and aligned so that said radiation directed upwardly by the respective mirror layer on the first carrier part passes therethrough;

said mirror layer on said first carrier part being provided with a beam splitter for reflecting the radiation emitted by the laser chip and also for allowing radiation fed in from a light waveguide above said module and passing through said lens coupling optics to pass through beneath said first carrier part having said beam splitter;

a light receiving element beneath said first carrier part having said beam splitter for receiving said fed in radiation which is passed through by the beam splitter, said light receiving element being positioned beneath said common carrier; and a housing at least partially surrounding said lens coupling optics, laser chip, beam splitter, and first and second carrier parts.

2. A module according to claim 1 wherein said light receiving element comprises a light receiver.

3. A module according to claim 1, wherein said light receiving element comprises an optical coupling for directing light to a light receiver.

4. A module according to claim 3 wherein said optical coupling for the light receiver comprises a light waveguide.

5. A module according to claim 3 wherein said optical coupling for the light receiver comprises a further lens coupling optics.

6. A module according to claim 1 wherein said common carrier is comprised of silicon.

7. A module according to claim 1 wherein said beam splitter divides a specific wavelength in a predetermined ratio.

8. A module according to claim 1 wherein said beam splitter is a wavelength-selective beam splitter.

9. A module according to claim 1 wherein said light entry and exit faces on opposite sides of said lens coupling optics are provided with an optical coupling.

10. A module according to claim 1 wherein the first and second carrier parts comprise glass and have a trapezoidal profile.

11. A module according to claim 1 wherein said first and second carrier parts are comprised of silicon and have a trapezoidal profile.

12. A module according to claim 1 wherein said respective mirror layers on said lateral faces of said first and second carrier parts are layers of dielectric material.

13. A module according to claim 1 wherein said lens coupling optics comprises a lens chip having an integrated refractive lens.

14. A module according to claim 1 wherein said lens coupling optics comprises a lens chip having an integrated defractive lens.

15. A module according to claim 1 wherein said lens coupling optics comprises a lens chip having an element selected from the group consisting of silicon, silicon carbide, gallium phosphide, and glass.

16. A module according to claim 1 wherein a monitor chip is arranged on the second carrier part and is positioned above the mirror layer on the second carrier part.

17. A module according to claim 1 wherein a monitor chip is arranged above said mirror layer of said second carrier part.

18. A module according to claim 1 wherein said light receiving element comprises a photodiode.

19. A module according to claim 1 wherein said light receiving element comprises a phototransistor.

20. A module according to claim 1 wherein said light receiving element comprises a photo-IC having an amplifier.

21. A module according to claim 20 wherein said amplifier is integrated with said photo-IC.

22. A transmission and reception module for bidirectional message and signal transmission via a light waveguide, comprising:

a common carrier having a laser chip as a light transmitter thereon, and first and second carrier parts also on the common carrier with a laser chip therebetween, the first and second carrier parts having lateral surfaces neighboring resonator faces of the laser chip, said lateral surfaces having respective mirror layers inclined at an angle relative to the resonator faces of the laser chip so that radiation emitted by the laser chip is directed substantially upwardly relative to the common carrier;

a lens coupling optics arranged above the laser chip and connected to at least said first carrier part and aligned so that said radiation directed upwardly passes therethrough;

said mirror layer on said first carrier part being provided with a beam splitter for reflecting the radiation emitted by the laser chip and also for allowing radiation fed in from above said module and passing through said lens coupling optics to pass through beneath said first carrier part having said beam splitter;

a light receiving element beneath said first carrier part for receiving said fed in radiation which is passed through by the beam splitter, said light receiving element being positioned beneath said common carrier;

a housing at least partially surrounding said lens coupling optics, laser chip, and first and second carrier parts; and a monitor element for monitoring light from said laser chip connected at least to said second carrier part and positioned to receive radiation emitted by the chip and reflected by the mirror layer on the second carrier part.

23. A transmission and reception module for bidirectional message and signal transmission via a light waveguide, comprising:

a common carrier having a laser chip as a light transmitter thereon, and a carrier part on the common carrier with a laser chip adjacent the carrier part, the carrier part having a slanted lateral surface neighboring a resonator face of the laser chip, said lateral surface having a mirror layer thereon at an angle relative to the resonator face of the laser chip so that radiation emitted by the laser chip is directed substantially upwardly relative to and away from the common carrier;

a lens coupling optics arranged above the laser chip and secured to the carrier part and aligned so that said radiation directed upwardly by said mirror passes therethrough;

said mirror layer on said carrier part being provided with a beam splitter for reflecting the radiation emitted by the laser chip and also for allowing radiation fed in from above said module and passing through said lens coupling optics to pass through beneath said carrier part having said beam splitter;

a light receiving element beneath said carrier part for receiving said fed in radiation which is passed through by the beam splitter, said light receiving element being positioned beneath said common carrier in a bottom plate; and said common carrier being attached to a top surface of said bottom plate.

* * * * *